United States Patent [19]

Goodnough et al.

[11] Patent Number: 4,857,725
[45] Date of Patent: Aug. 15, 1989

[54] DIFFERENTIAL OFFSET CORRECTED CURRENT MIRROR

[75] Inventors: Mark A. Goodnough, Buellton; John A. Stineman, Jr.; Alan W. Hoffman, both of Goleta, all of Calif.

[73] Assignee: Santa Barbara Research Center, Goleta, Calif.

[21] Appl. No.: 215,839

[22] Filed: Jul. 6, 1988

[51] Int. Cl.$^4$ .............................................. H03F 17/00
[52] U.S. Cl. .................. 250/214 A; 307/311; 330/59
[58] Field of Search ........... 250/214 A, 214 AG, 578; 307/311; 330/59, 308

[56] References Cited

U.S. PATENT DOCUMENTS

| | | | |
|---|---|---|---|
| 4,498,001 | 2/1985 | Smoot | 330/288 |
| 4,540,952 | 9/1985 | Williams | 330/282 |
| 4,574,249 | 3/1986 | Williams | 330/284 |
| 4,609,880 | 9/1986 | Dermitzakis et al. | 330/59 |
| 4,623,786 | 11/1986 | Rodwell | 250/214 A |
| 4,766,396 | 8/1988 | Taya et al. | 330/288 |
| 4,805,236 | 2/1989 | Urala | 330/59 |

Primary Examiner—David C. Nelms
Assistant Examiner—Stephone B. Allen
Attorney, Agent, or Firm—M. J. Meltzer; W. C. Schubert

[57] ABSTRACT

A current mirror circuit 10 is coupled to a first and a second photodetector 18 and 20 and differentially couples together the two photodetectors to an amplifier 12 such that a resulting differential output current is independent of the intrinsic responsivity difference between the two photodetectors. The circuit includes a first transistor 14 having an input terminal coupled to an output terminal of the first photodetector and a second transistor 16 having an input terminal coupled to an output terminal of the second photodetector. A capacitance 22 is coupled between a control terminal of the first transistor and a control terminal of the second transistor, the control terminal of the first transistor further being coupled to the input terminal of the first transistor. A first switch 24 is coupled between the control terminal of the second transistor and the input terminal of the second transistor. A second switch 26 is coupled between the second transistor input terminal and an input of the transimpedance amplifier for coupling the output current signal to the transimpedance amplifier. Preferably the transistors are MOSFETs operated in subthreshold. During calibration the first switch is closed and the photodetectors are illuminated by a reference flux. A voltage stored across the capacitance is shown to be expressive of the difference in threshold voltage between the two MOSFETs and also the logarithm of the ratio of detector responsivities.

13 Claims, 2 Drawing Sheets

DIFFERENTIAL OFFSET CORRECTED CURRENT MIRROR

FIELD OF THE INVENTION

This invention is related generally to photodetectors and, in particular, to a circuit for differentially coupling two photodetectors to a transimpedance amplifier such that a magnitude of a differential output current is independent of responsivity differences between the two photodetectors.

BACKGROUND OF THE INVENTION

In a focal plane array of differential photodetectors, such as an array suitable for edge detection or targeting systems, the individual detector responsivities may vary by 10 percent or more between detectors. This variation in responsivity presents a problem, especially in large background applications in the presence of a relatively dim target, in that the difference signal delivered to an off-focal plane processor contains a background component having a magnitude related to the difference in responsivities between the two photodetectors. This background component can be compensated for by off-focal plane processors or by restricting the upper end of the dynamic range to approximately the value of the difference in responsivity between the two photodetectors; for example approximately 10 percent. However, in relation to the former compensation method off-focal plane processors are expensive. Also, for those applications wherein package size and power consumption are important considerations, such as in relatively small guided missiles, additional off-focal plane processors are generally undesirable. In relation to the latter compensation method restriction of the dynamic range may be undesirable when increased sensitivity is required in that an increase in sensitivity typically dictates a smaller upper end dynamic range.

Alternate methods of providing responsivity difference compensation for two photodetectors are depicted in FIGS. 1 and 2. In FIG. 1 two differential detectors are connected in an anode to cathode configuration and provide a signal to a single amplifier such as, for example, a reset integrator-type bilateral transimpedance amplifier which integrates both positively and negatively. However, the difference in responsivities must be compensated for in an off-focal plane processor wherein the dynamic range may be consumed entirely by the responsivity variations. Another, more fundamental, problem with this technique is that an integrated array of such differential detectors is not readily fabricated using conventional array fabrication methodologies in that conventional fabrication permits, within an array, either all cathodes or all anodes of photodetectors to be coupled together to a common node.

In FIG. 2 there is shown a separate transimpedance amplifier for each detector, the amplifier outputs being coupled to an off-focal plane differencing and responsivity compensating processor. This technique, although readily achievable by present processing techniques, requires that the entire dynamic range be defined by the maximum background level, resulting in a significant decrease in sensitivity. Furthermore, no background suppression occurs at the focal plane, placing a larger signal processing burden on the off-focal plane electronics.

It is therefore one object of the invention to provide a circuit to differentially couple together two photodetectors to an amplifier such that a resulting differential output current is independent of the intrinsic responsivity difference between the two photodetectors.

It is a further object of the invention to provide a circuit to differentially couple together two photodetectors to an amplifier such that a resulting output current is proportional to the difference in radiation flux received by each of the photodetectors.

It is a further object of the invention to provide a circuit to differentially couple together two photodetectors to an amplifier such that a resulting output current is proportional to the difference in radiation flux received by each of the photodetectors, the circuit being useable with any known type of current-mode photodetector, including both photo-voltaic and photo-conductive detectors.

It is another object of the invention to provide a circuit to differentially couple together two photodetectors to an amplifier such that a resulting differential output current is independent of the intrinsic responsivity difference between the two photodetectors, the circuit also providing an autocalibration capability.

It is still another object of the invention to provide a circuit to differentially couple together two photodetectors to a transimpedance amplifier, the circuit including a pair of MOSFET transistors operated in a subthreshold region and a capacitor which stores a logarithmic representation of a ratio of detector responsivities and also a representation of a threshold difference between the MOSFET transistors.

It is one still further object of the invention to provide a circuit to differentially couple together two photodetectors to a transimpedance amplifier, the circuit including a pair of MOSFET transistors operated in a subthreshold region and a capacitor, and to a method of calibrating the circuit which includes uniformly illuminating both detectors with a reference flux such that the capacitor stores a logarithmic representation of a ratio of detector responsivities and also a representation of a threshold difference between the MOSFET transistors.

SUMMARY OF THE INVENTION

The foregoing problems are overcome and the objects of the invention are met by a differential offset corrected current mirror circuit which is constructed and operated in accordance with the teaching of the invention. The current mirror circuit is coupled to a first and a second photodetector for receiving output currents therefrom. The circuit differentially couples together the two photodetectors to an amplifier such that a resulting differential output current is independent of the intrinsic responsivity difference between the two photodetectors. The current mirror circuit includes a first transistor having an input terminal coupled to an output terminal of the first photodetector and a second transistor having an input terminal coupled to an output terminal of the second photodetector. A capacitance is coupled between a control terminal of the first transistor and a control terminal of the second transistor, the control terminal of the first transistor further being coupled to the input terminal of the first transistor. A first switch is coupled between the control terminal of the second transistor and the input terminal of the second transistor. A second switch is coupled between the second transistor input terminal and an input of the transimpedance amplifier for coupling the output current signal to the transimpedance amplifier. Preferrably the first and second transistors are MOSFETs operated in a subthreshold condition. During a calibration mode the first switch is closed and the second switch is opened and the photodetectors are each illuminated by a reference flux. A voltage stored across the capacitance is shown to be expressive of the difference in threshold voltage between the two MOSFETs and also the logarithm of the ratio of detector responsivities.

BRIEF DESCRIPTION OF THE DRAWING

These and other aspects of the invention will be made more apparent in the following Detailed Description of a Preferred Embodiment read in conjunction with the attached Drawing, wherein.

DETAILED DESCRIPTION OF A PREFERRED EMBODIMENT

Figure 1:
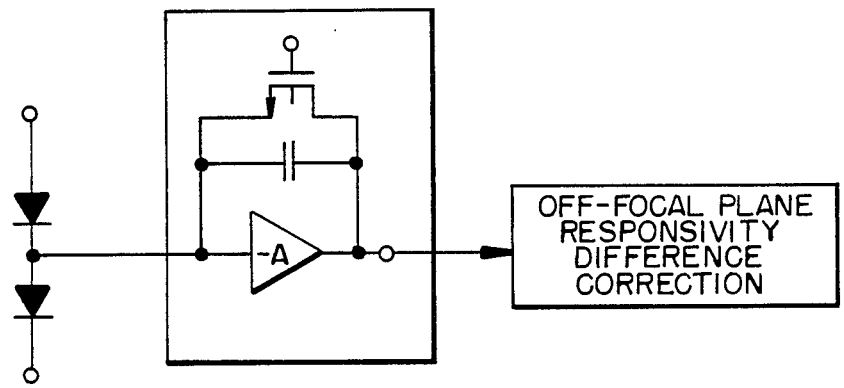
FIG. 1 is a simplified block diagram of a conventional technique of coupling together two photodetectors of a differential pair in an anode to cathode configuration.
Figure 2:
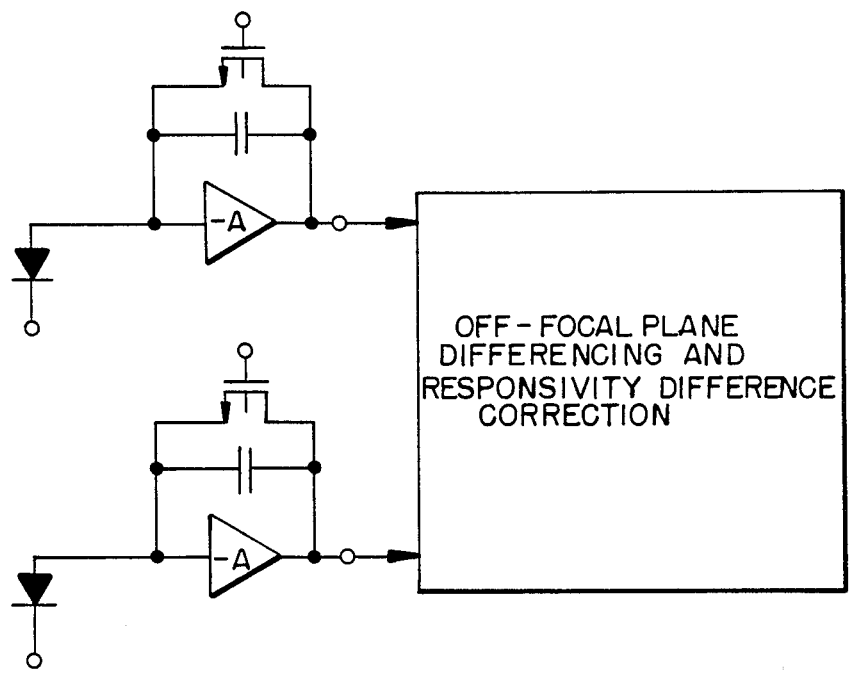
FIG. 2 is a simplified block diagram of another conventional technique of coupling each photodetector of a differential pair to a separate transimpedance amplifier.
Figure 3:
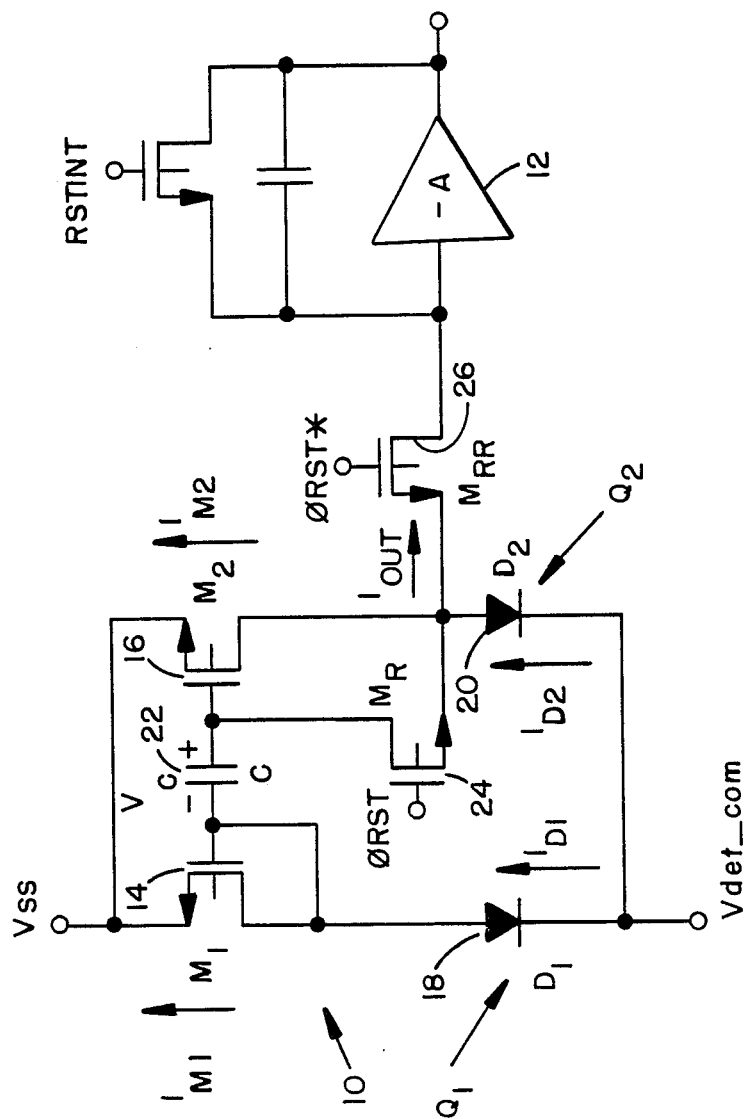
FIG. 3 is a schematic diagram of a differential offset corrected current mirror circuit constructed in accordance with the invention, the circuit comprising two MOSFET transistors ($M_1$ and $M_2$) coupled to the anodes of two photodiodes ($D_1$ and $D_2$) and a capacitor (C) coupled between the gates of the two transistors, an output of the circuit being coupled to the input of a bilateral transimpedance amplifier.

Referring now to FIG. 3 there is illustrated in schematic diagram form a presently preferred embodiment of a differential offset corrected current mirror circuit 10 constructed in accordance with the invention. Although the ensuing description will be made in the context of N-channel Metal-Oxide Semiconductor Field Effect Transistors (MOSFETs) with P-on-N type photodiodes it should be understood the P-channel MOSFETs may be employed with N-on-P type photodiodes and that either P-channel or N-channel MOSFETs may be used with photoconductive, as opposed to the illustrated photovoltaic, devices. It should also be realized that although a bilateral transimpedance amplifier 12 of the reset integrator type is shown that any type of bilateral transimpedance amplifier may be coupled to the output of the circuit. Furthermore, the invention may be practiced with silicon photodiodes or with photodiodes or photoconductors which are comprised of Group II-VI material, such as HgCdTe.

Transistors M1 14 and M2 16 each have a drain terminal coupled together in common to a voltage source Vss and an input source terminal coupled to an anode of a corresponding photodiode, D1 18 and D2 20. The cathodes of D1 18 and D2 20 are coupled in common to a potential Vdetcom. A control, or gate, terminal of both M1 14 and M2 16 are coupled together through a capacitance C 22. In addition, the gate terminal of M1 14 is connected to the anode of D1 18 while the gate terminal of M2 16 is coupled to the anode of D2 20 through a first transistor switch MR 24. A gate terminal of MR 24 is coupled to a signal PhiRST which is employed during a reset/calibration of the circuit 10. The output current of the circuit 10 ($I_{out}$) is coupled through a second transistor switch MRR 26 to an input of the transimpedance amplifier 12. A gate terminal of MRR 26 is coupled to a signal PhiRST* which is the complement of PhiRST.

Thus, when PhiRST is asserted, during reset/calibration of the circuit 10, switch MR 24 is on and PhiRST* is simultaneously deasserted and switch MRR 26 is off, thereby uncoupling $I_{OUT}$ from amplifier 12. Conversely, during normal operation of the circuit 10 PhiRST is deasserted (MR 24 is off) and PhiRST* is asserted, holding switch MRR 26 on and coupling the current $I_{OUT}$ to amplifier 12.

A typical value for Vss ranges between −1 and −5 volts when Vdetcom is approximately at ground potential. The value of C 22 is a function of the type of detector employed and the active detector area. In general the value of C 22 may be determined as the function 50 nanofarads/cm² of active detector area.

Preferably M1 14 and M2 16 are operated in a subthreshold condition in order to enable the operation of the auto-calibration feature of the invention. It is the logarithm-exponentiation characteristic of the subthreshold current-mirror relationship which permits a multiplicative auto-calibration correction to be accomplished through a voltage addition. It should be noted that the circuit 10 will operate correctly in the saturation region of M1 14 and M2 16 and still absorb the M1 and M2 threshold differences appearing across C 22. However, operation in the saturation region will not permit the photodetector responsivity difference compensation to occur.

In order to ensure that M1 14 and M2 16 operate in subthreshold the following relationship should be maintained:

$$I_{DiMAX} < \frac{2W\mu_n C_{ox}}{L}(mV_{TH})^2 \tag{1}$$

where
W and L are the gate dimensions of M1 and M2,
$C_{ox}$ is the gate oxide capacitance per unit area,
$\mu_n$ is the surface mobility of M1 and M2,
m is a ratio of gate oxide to depletion capacitances (normally between 1 and 3), and
$V_{TH}$ is a thermal equivalent voltage (kT/q).

It should be noted that the term W/L of M1 14 and M2 16 or the dimensions of the detectors (D1 18 and D2 20) may be readily manipulated during fabrication of the circuit 10 in order to ensure subthreshold operation.

In general M1 14 and M2 16, when maintained in a subthreshold condition, operate in accordance with the following relationship:

$$I_{Mi} = I_o e^{\frac{V_{gsi} - V_{TH}}{mV_{TH}}} . \tag{2}$$

This relationship assumes that the dark current of D1 18 and D2 20 is negligible and that a small voltage deviation from detector to detector has a negligible effect. If desired, these conditions could also be expressed within equation 2. It should also be noted that both D1 18 and D2 20 will each have impressed thereon the threshold variation of the associated driving MOSFET transistor, M1 14 and M2 16, respectively. This threshold variation may induce as much as a 50 mVolt peak to peak variation in detector bias. Under such conditions the detector current can be expressed as:

$$I_{Di} = q\eta_i A_{Di} Q_i \tag{3}$$

where
q equals $1.602 \times 10^{-19}$ Coulombs/electron, $\eta_i$ is the quantum efficiency of the ith detector,
$A_{Di}$ is the optical area of the ith detector, and
$Q_i$ is the flux incident on the ith detector.

It is pointed out that the product of $\eta_i$ and $A_{Di}$ comprises those elements of responsivity which vary from detector to detector and it is this product which is compensated for by the circuit 10 of the invention, as will be shown below.

Circuit 10 may be considered to operate in one of two conditions or modes. A first mode is a reset mode and a second is a normal mode. The operation of circuit 10 under these two conditions will now be described.

In the reset mode of operation PhiRST is asserted and MR 24 is on or closed while PhiRST* is deasserted and MRR 26 is off or open. The flux incident on both D1 18 and D2 20 ($Q_1$ and $Q_2$) is equal to a reference flux ($Q_{REF}$) generated by the aforementioned greybody calibration source. The assertion of PhiRST operates to acquire a sample of the two transistor threshold voltages and detector responsivities. This sample is stored on C 22 for use during the normal mode of operation. The reset mode should not be confused with the periodic reset operation, controlled by RSTINT, of any of the types of transimpedance amplifiers which may be coupled to the circuit 10. The reset mode of circuit 10 is preferably performed only as required, perhaps only once per mission.

During the reset mode, for the previously given subthreshold current relationship (equation 1) and the detector current relationship (equation 3), the resulting voltage on C 22 can be determined as follows:

$$I_{M1} = I_{D1} \to V_{gs1} = mV_{TH}\text{Ln}\frac{q\eta_1 A_{D1} Q_{REF}}{I_o} + V_{T1}, \quad (4)$$

$$I_{M2} = I_{D2} \to V_{gs2} = mV_{TH}\text{Ln}\frac{q\eta_2 A_{D2} Q_{REF}}{I_o} + V_{T2} \quad (5)$$

and $$V_c = V_{gs2} - V_{gs1} = mV_{TH}\text{Ln}\frac{\eta_2 A_{D2}}{\eta_1 A_{D1}} + V_{T2} - V_{T1} \quad (6)$$

and

Thus, it can be seen that the voltage $V_c$ across C 22 is expressive of the two threshold voltages and the logarithm of the ratio of the responsivity terms.

The required duration of the signal PhiRST is variable and is a function of at least the characteristics of the particular detectors and the capacitance of C 22. Typically, PhiRST is asserted for from approximately one to 100 microseconds.

In the normal mode of operation PhiRST* is asserted and MRR 26 is on or closed while PhiRST is deasserted and MR 24 is off or open. The flux incident on D1 18 and D2 20 is $Q_1$ ($Q_{SIG1}$) and $Q_2$ ($Q_{SIG2}$), respectively, which are the image flux, both target and background. During the normal mode of operation $I_{OUT}$ is proportional to the fluxes $Q_{SIG1}$ and $Q_{SIG2}$. $I_{OUT}$ is converted to a voltage representation by the transimpedance amplifier 12 which may thereafter be multiplexed, with others of such circuits, to off-focal plane signal processing electronics.

The magnitude of the output current $I_{OUT}$ can be calculated as follows:
from equation 4, $$I_{M1} = I_{D1} \to V_{gs1} = mV_{TH}\text{Ln}\frac{q\eta_1 A_{D1} Q_{REF}}{I_o} + V_{T1},$$

using equations 5 and 6, $$V_{gs2} = V_c + V_{gs1} = mV_{TH}\text{Ln}\frac{q\eta_2 A_{D2} Q_{REF}}{I_o} + V_{T2} \quad (7)$$

then $$I_{M2} = I_o e^{\frac{V_{gs2} - V_{T2}}{mV_{TH}}} = q\eta_2 A_{D2} Q_{SIG1} \quad (8)$$

and $$I_{OUT} = I_{D2} - I_{M2} = q\eta_2 A_{D2}(Q_{SIG2} - Q_{SIG1}). \quad (9)$$

Thus, $I_{OUT}$ is proportional only to the difference in fluxes incident upon the two detectors, which is the desired result.

What has been described above is a presently preferred embodiment of the invention. Furthermore, and in accordance with at least the equations 1 through 9, it has been pointed out that the invention may be broadly applied to a variety of radiation detectors constructed from a number of different materials, such as silicon and Group II–VI material. It is therefore anticipated that, based upon the foregoing description, those having skill in this art may derive modifications to this presently preferred embodiment. Thus, it should be understood that this invention is not to be considered to be limited to the above described preferred embodiment but is, instead, intended to be limited only as the invention is defined by the claims which follow.

What is claimed is:

1. A circuit for coupling a first photodetector and a second photodetector to an amplifier, the first and the second photodetectors each having a current output proportional to an amount of radiation flux incident thereon, comprising:
    a first transistor having an input terminal coupled to an output terminal of the first photodetector;
    a second transistor having an input terminal coupled to an output terminal of the second photodetector;
    a capacitance coupled between a control terminal of said first transistor and a control terminal of said second transistor, said control terminal of said first transistor further being coupled to said input terminal of said first transistor;
    a first switch coupled between the control terminal of said second transistor and said input terminal of said second transistor; and
    a second switch coupled between said second transistor input terminal and an input of the amplifier for coupling an output current signal to the amplifier.

2. A circuit as defined in claim 1 wherein said first and said second transistors are MOSFETs and wherein, when said first switch is closed, said capacitance stores a signal expressive of at least a difference in threshold voltage between said first and said second transistors.

3. A circuit as defined in claim 2 wherein said transistors are operated in a subthreshold condition and wherein, when said first switch is closed, the signal stored by said capacitance is further expressive of a difference in responsivity to incident radiation flux between the first photodetector and the second photodetector.

4. A circuit as defined in claim 3 wherein when said first switch is closed said second switch is open and when said first switch is open said second switch is closed and couples the output current signal to the amplifier, the output current signal being expressive of substantially only the difference in fluxes incident on the first and the second photodetectors.

5. A current mirror circuit for coupling a first photodetector and a second photodetector to a transimpedance amplifier, the first and the second photodetectors each having a current output proportional to an amount of radiation flux incident thereon, comprising:
  a first MOSFET transistor having an input terminal coupled to an output terminal of the first photodetector;
  a second MOSFET transistor having an input terminal coupled to an output terminal of the second photodetector;
  a capacitance serially coupled between a gate terminal of said first MOSFET transistor and a gate terminal of said second MOSFET transistor, said gate terminal of said first MOSFET transistor further being coupled to said input terminal of said first MOSFET transistor;
  a first MOSFET switch coupled between the gate terminal of said second MOSFET transistor and said input terminal of said second MOSFET transistor; and
  a second MOSFET switch coupled between said second MOSFET transistor input terminal and an input of the transimpedance amplifier for coupling an output current signal to the transimpedance amplifier.

6. A current mirror circuit as defined in claim 5 wherein when said first MOSFET switch is on, said capacitance stores a signal expressive of at least a difference in threshold voltage between said first and said second MOSFET transistors.

7. A current mirror circuit as defined in claim 6 wherein said first and said second MOSFET transistors are operated in a subthreshold condition and wherein, when said first MOSFET switch is on, the signal stored by said capacitance is further expressive of a difference in responsivity to incident radiation flux between the first photodetector and the second photodetector.

8. A current mirror circuit as defined in claim 7 wherein when said first MOSFET switch is on said second MOSFET switch is off and when said first MOSFET switch is off said second MOSFET switch is on and couples the output current signal to the amplifier, the magnitude of the output current signal being a function of the signal stored by said capacitance.

9. A current mirror circuit as defined in claim 8 wherein the magnitude of the output current signal is expressive of substantially only the difference in fluxes incident on the first and the second photodetectors.

10. A method of coupling a first photodetector and a second photodetector to a transimpedance amplifier, the first and the second photodetectors each having a current output proportional to an amount of radiation flux incident thereon, comprising the steps of:
  providing a current mirror circuit which is coupled to the photodetectors for receiving the output currents therefrom, the current mirror circuit comprising a first transistor having an input terminal coupled to an output terminal of the first photodetector; a second transistor having an input terminal coupled to an output terminal of the second photodetector; a capacitance coupled between a control terminal of the first transistor and a control terminal of the second transistor, the control terminal of the first transistor further being coupled to the input terminal of the first transistor; a first switch coupled between the control terminal of the second transistor and the input terminal of the second transistor; and a second switch coupled between the second transistor input terminal and an input of the transimpedance amplifier for coupling an output current signal to the transimpedance amplifier;
  calibrating the current mirror circuit by performing the steps of:
  closing the first switch and opening the second switch;
  illuminating both the first and the second photodetectors from a source of reference flux;
  storing a signal on the capacitance, the signal being expressive of at least a difference in threshold voltage between the first and said second transistors; and
  closing the second switch and opening the first switch;
  the method further comprising a step of operating the current mirror circuit by illuminating the photodetectors with flux from an image; and
  providing the output current to the amplifier, the output current having a magnitude which is a function at least of the magnitude of the image flux upon each of the photodetectors and also the magnitude of the signal stored upon the capacitance.

11. A method as defined in claim 10 wherein the transistors are MOSFETs operated in a subthreshold condition and wherein the step of storing a signal on the capacitance includes storing a signal which is expressive of a difference in responsivity between the first and the second photodetectors.

12. A method as defined in claim 10 wherein the transistors are MOSFETs operated in a subthreshold condition and wherein the step of storing a signal on the capacitance includes storing a signal which is expressive of a logarithm of the ratio of responsivity between the first and the second photodetectors.

13. A method as defined in claim 12 wherein the magnitude of the current ($I_{OUT}$) provided to the transimpedance amplifier is given by the equation $$I_{OUT} = q\eta_2 A_{D2}(Q_{SIG2} - Q_{SIG1})$$

where
  q equals $1.602 \times 10^{-19}$ Coulombs/electron,
  $\eta_2$ is the quantum efficiency of the second photodetector,
  $A_{D2}$ is the optical area of the second photodetector,
  $Q_{SIG1}$ is the image flux incident on the first photodetector, and
  $Q_{SIG2}$ is the image flux incident on the second photodetector.

* * * * *